United States Patent

[11] 3,596,184

[72] Inventors George M. Hanus
Norridge;
Alfred R. Lucas, Northbrook, both of, Ill.

[21] Appl. No. 850,447
[22] Filed Aug. 15, 1969
[45] Patented July 27, 1971
[73] Assignee Motorola, Inc.
Franklin Park, Ill.

[54] SQUELCH CIRCUIT WITH SQUELCH TAIL ELIMINATION
10 Claims, 2 Drawing Figs.

[52] U.S. Cl. 325/478
[51] Int. Cl. H04b 1/10
[50] Field of Search 325/478, 479, 480; 330/17

[56] References Cited

UNITED STATES PATENTS

| | | | |
|---|---|---|---|
| 3,196,354 | 7/1965 | Engelbrecht | 325/478 |
| 3,430,147 | 2/1969 | Hennessey et al. | 325/478 |
| 3,492,594 | 1/1970 | Seim | 330/17 |

*Primary Examiner*—Robert L. Griffin
*Assistant Examiner*—Anthony H. Handal
*Attorney*—Mueller & Aichele

ABSTRACT: An integrated circuit includes, on a single chip, a noise-detection circuit and a squelch filter circuit having a short time constant ripple filter and a long time constant ripple filter. The noise detector includes a differential feedback amplifier with external circuitry for controlling the gain and frequency shaping of the amplifier in a feedback circuit. A high-impedance cascaded emitter-follower circuit of opposite conductivity transistors couples the noise detector to the ripple filters, with the long time constant ripple filter being responsive to signals just above the squelch threshold in order to provide maximum sensitivity and smooth operation. At strong signal levels, where such a long time constant ripple filter is not necessary, the circuit is switched to a short time constant filter by a signal level detection circuit. If the signal drops to a low signal level relatively slowly, the circuit switches back to the long time constant filter; but if the signal drops rapidly, as for example, where the transmitter ceases transmission, only the short time constant filter is operative and the turnoff of the squelch circuit is very rapid, thereby eliminating the noise burst or "squelch tail."

INVENTORS
GEORGE M. HANUS
ALFRED R. LUCAS
BY Mueller, Aichele & Rauner
ATTORNEYS.

INVENTORS.
GEORGE M. HANUS
ALFRED R. LUCAS
BY Mueller, Aichele & Rauner
ATTORNEYS.

SQUELCH CIRCUIT WITH SQUELCH TAIL ELIMINATION

BACKGROUND OF THE INVENTION

Reference is made to copending application Ser. No. 643,874, filed June 6, 1967, of James R. Glasser and Stanley J. Tomsa, now abandoned, and continuation application Ser. No. 28,169, filed Apr. 13, 1970, entitled "Squelch Circuit Having Short and Long Time Constant Filters for Squelch Tail Elimination".

Squelch circuits responsive to the detected receiver noise are used in communications receivers for eliminating noise output from the audio section during periods when no signal is received. Generally such squelch circuits are independent of the noise detector which is formed with particular parameters as a part of the particular receiver with which it is to be used. As a result, squelch circuits for use with various types of receivers necessarily must be matched to the signals provided by the receivers thereby rendering the universality of such squelch circuits difficult to achieve.

In order to obtain good threshold sensitivity and to avoid chattering during turn-on of the squelch circuit, sufficient filtering of the detected noise must be provided to reduce its ripple to an acceptable level. A filter having good threshold sensitivity has a relatively long time constant which increases the response time of the squelch circuit so that a "squelch tail" or noise burst is heard at the end of transmission. A filter having a relatively short time constant does not provide good threshold sensitivity.

SUMMARY OF THE INVENTION

It is an object of this invention to provide a squelch system which can perform the squelch function in a wide range of different communications receivers.

It is an additional object of this invention to provide an improved squelch filter circuit for a receiver for eliminating "squelch tails" while maintaining good flutter performance.

Another object of this invention is to provide a squelch-filtering circuit for a receiver wherein the squelch filter circuit operates to distinguish between fades or flutter and the end of a received transmission.

In accordance with a preferred embodiment of this invention, a combined noise detection and squelch filter circuit includes a feedback amplifier responsive to signals obtained from the radio receiver discriminator, with the components of the feedback circuit adjusting the gain and the frequency shaping of the amplifier. The output of the feedback amplifier is applied through an amplitude-limiting circuit providing a decreasing output as the signal to the receiver is slowly increased. The output of the limiter circuit is applied to a noise-detection circuit which develops an increasing DC level as the received signal increases. This signal level is applied trough a squelch filter circuit including two filters, one having a short time constant and the other having a long time constant.

The circuit is adjusted so that the long time constant filter develops a higher output voltage than the short time constant filter and is used for signals just above the squelch threshold in order to provide good sensitivity and smooth operation of the squelch circuit. A signal level detector is provided for sampling either the detected noise signal or the output of the short time constant ripple filter for developing a control signal when the magnitude of the sampled signal is greater than a predetermined level. This control signal then operates to interrupt the long time constant filter, so that the short time constant filter is the only filter operative in the circuit for signal levels above this threshold magnitude. As a consequence, the squelch operates rapidly when a signal no longer is received, to reduce or eliminate the "squelch tail."

A fast-charging circuit, forming part of the long time constant filter, returns control of the squelch to the long time constant filter when the signal drops relatively slowly as in fade and flutter. The outputs of the two squelch filter circuits are applied to two inputs of a gating circuit which provides isolation of the filter circuits, and the output of which is used to control the audio switch of the radio receiver.

DETAILED DESCRIPTION

Figure 1:
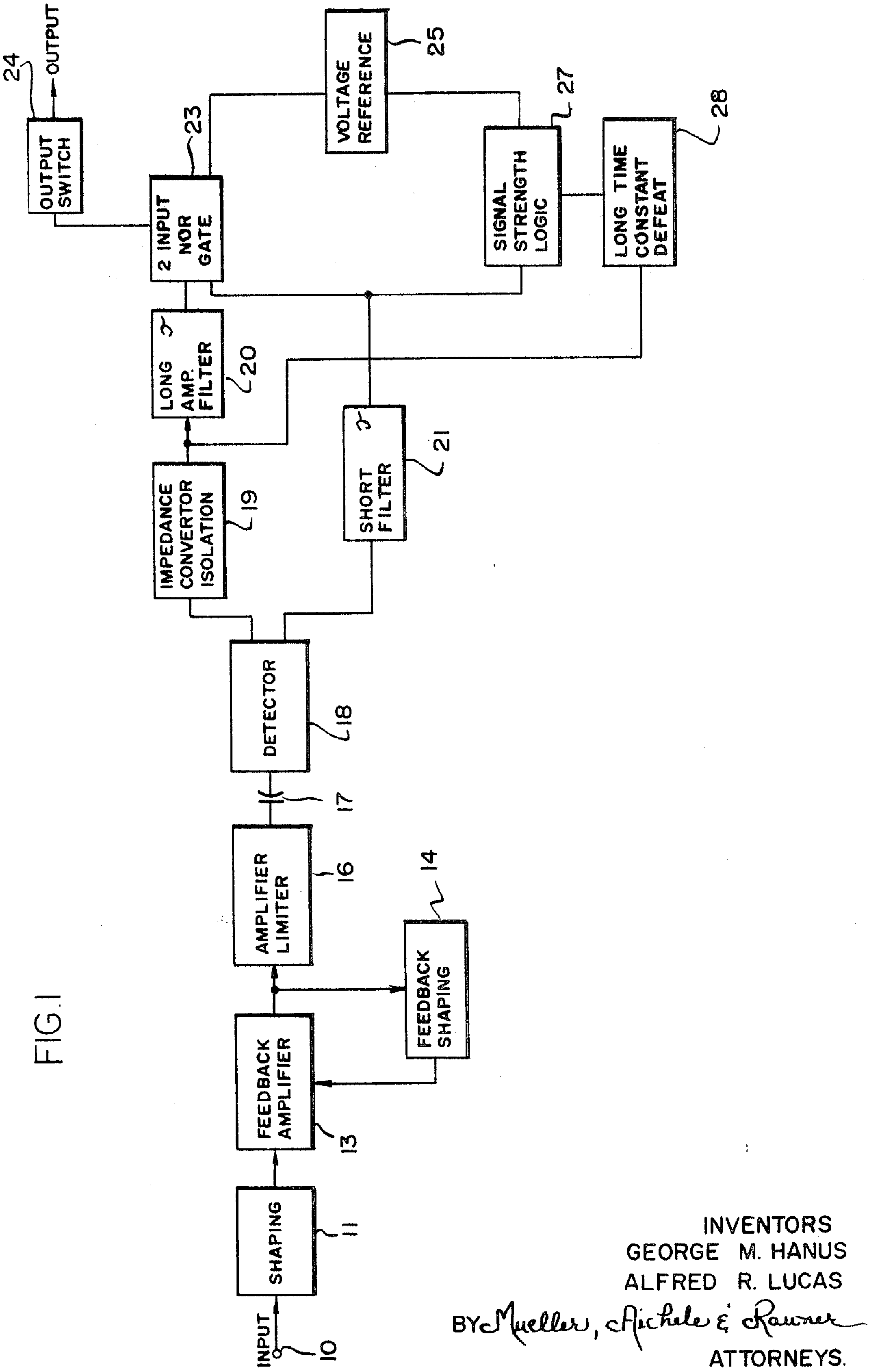
FIG. 1 is a block diagram of a noise detection and squelch filter circuit.

Referring now to FIG. 1, there is shown a block diagram of a noise-detection and squelch filter circuit in accordance with a preferred embodiment of this invention. Signals from the output of the discriminator of a radio receiver are supplied through an input terminal 10 to a frequency-shaping circuit 11 which selects the frequency band sampled and provides the proper gain at the audio frequencies for the signals supplied to the input of a feedback amplifier 13. Additional frequency shaping of the signal obtained from the output of the feedback amplifier 13 is provided by a feedback-shaping circuit 14 which also is used to set the overall gain of the amplifier 13.

The output of the feedback amplifier 13 is directly coupled to an amplifier limiter stage 16 which processes the signal output from the amplifier 13 to couple the high frequency noise components through a coupling capacitor 17 to a noise-detection circuit 18. In the circuit shown in FIGS. 1 and 2, the noise components which are coupled by the limiter circuit 16 to the detector 18 are in the frequency range between 10 and 20 kHz. This band of noise provides optimum squelch sensitivity; and by frequency shaping of the signals processed by the feedback amplifier 13 and the limiter 16, "lockup," the straight feedthrough of audio distortion and audio signals which appear as noise, is caused to occur at frequencies which are higher than the normal audio frequencies.

As the signal to the receiver is slowly increased, the noise is slowly quieted. This results in the voltage output of the noise detector 18 rising, with this output being applied directly to a short time constant filter circuit 21 and through a high impedance isolation circuit 19 to a long time constant filter circuit 20. When a critical point in this voltage is reached, an audio switch 24 is turned on by the output of the long time constant filter 20 applied to the switch 24 through one input of a two-input NOR gate 23. Control of the NOR gate 23 is obtained from the long time constant filter 20 which is adjusted to provide a higher voltage output than the short time constant circuit 21 for the conditions of operation just described. If the signal is now removed, the long time constant filter output slowly drops creating the normal squelch tail at signal termination.

The output of the short time constant filter is continuously compared with a reference voltage obtained from a reference source 25 (which also provides a reference level for the NOR gate 23) in a signal strength comparison circuit 27, with the comparison circuit 27 providing an output when the output of the short time constant filter 21 exceeds a predetermined amplitude, which is indicative of a strong received signal. The output signal from the comparator circuit 27 then is applied to a long time constant defeat circuit 28 which operates to cut off the signal applied to the input of the long time constant filter 20, thereby to reduce the filtered noise voltage output signal from the filter 20.

Although the comparator circuit 27 has been shown connected to the output of the short time constant filter circuit 21, it also could be coupled to the output of the noise detector circuit 18, since the signals appearing at the output of the filer circuit 21 and the output of the noise detector circuit 18 both are a measure of the magnitude of the received signal. Irrespective of the source of the signal applied to the input of the comparator 27, an output is obtained in response to input signals in excess of a predetermined magnitude established by the voltage reference from the source 25 in order to cut off the input to the long time constant filter circuit 20 so long as the input signal level remains above this magnitude.

With the output signal level from the filter circuit 20 being thus reduced, the control of the two input NOR gate 23 then is obtained from the output of the short time constant filter circuit 21, with the NOR gate 23 isolating the outputs of the filter circuits 20 and 21 from one another. A rapid drop in the received signal, such as would occur if the transmitted signal stops, results in a rapid turnoff of the squelch circuit since the short time constant ripple filter 21 controls the circuit through the NOR gate 23, and the long time constant filter circuit 20 is unable to develop a filtered noise voltage signal in such a short time interval.

With relatively slow reductions in the signal strength of the received signal, however, which could be caused by flutter and fade, the control signal from the comparator circuit 27 ceases; and the fast-charging circuit connected to the long time constant filter 20 has sufficient time to develop a filtered noise voltage signal in the filter circuit 20. With the long time constant filter circuit 20 actuated, the noise voltage signal applied to the NOR gate 23, and from there to the output switch 24, is under the control of the filter circuit 20. The long time constant filter circuit 20 always dominates in weak signal conditions for providing good sensitivity and smooth operation.

Figure 2:
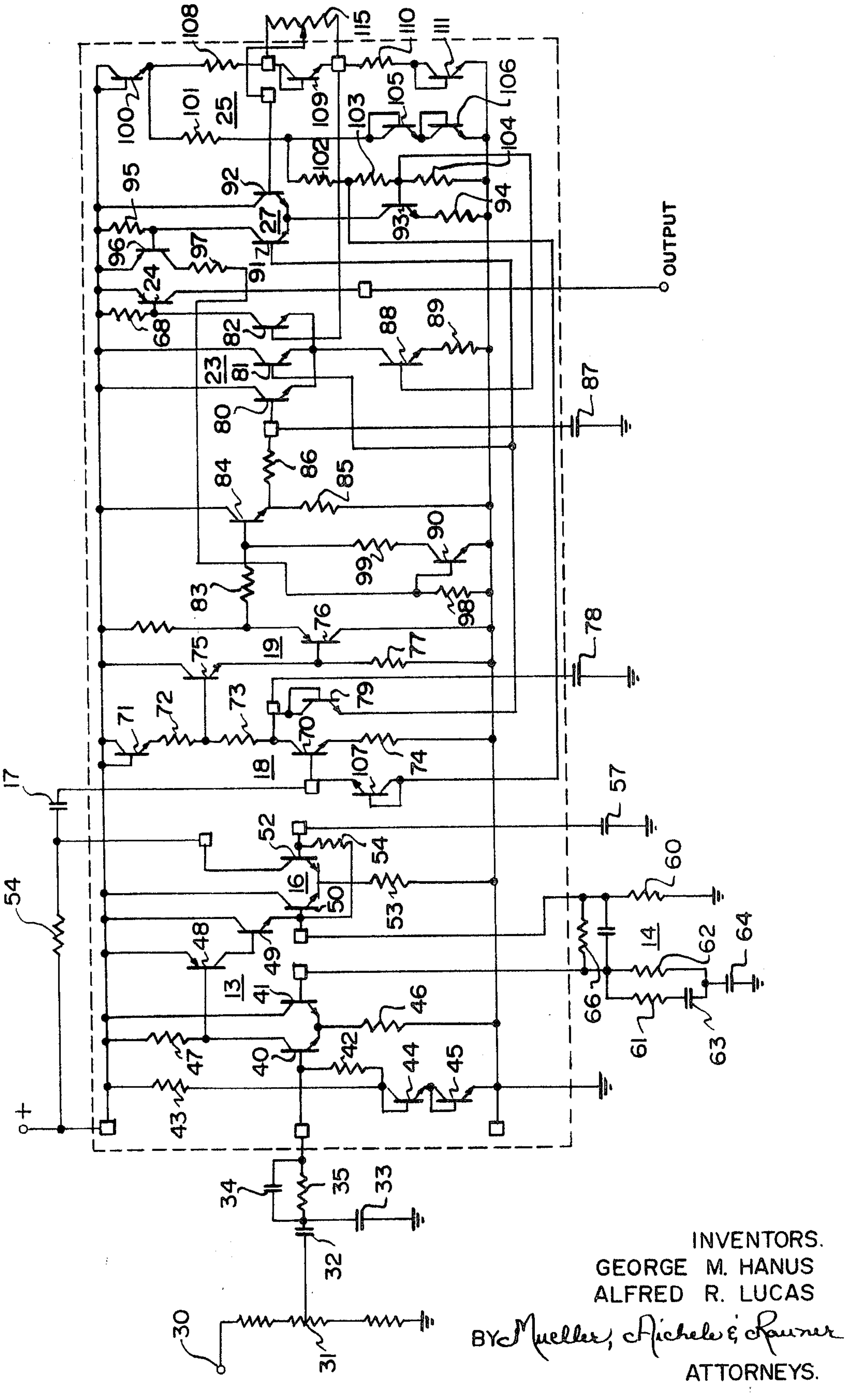
FIG. 2 is a schematic diagram of the circuit of FIG. 1.

Referring now to FIG. 2, there is shown a detailed schematic diagram of the noise detection and squelch circuit shown in block diagram form in FIG. 1, with the portion of the circuit of FIG. 2 shown enclosed by the dotted line being formed on a single silicon semiconductor integrated circuit chip. The output from the discriminator of any suitable FM receiver is applied to an input 30 across a voltage divider including a potentiometer 31 which is used to provide the signal level for the squelch control circuit shown in FIG. 2. Since the signals applied to the input terminal 30 are the discriminator output signals before deemphasis, the audio signal is included as well as the noise signals. DC isolation of these signals is provided by a coupling capacitor 32, and an additional capacitor 33 is connected to ground in order to remove the IF residual components from the noise voltage.

A frequency-shaping circuit including a third capacitor 34 and a resistor 35 is provided for selecting the desired frequency band and also provides the proper gain at the audio frequencies of the signals applied to an input terminal or bonding pad of the integrated circuit noise-detection and squelch system. These input signals are applied to the base of an NPN transistor 40 forming one of a pair of differential amplifier transistors 40 and 41, constituting part of the feedback amplifier 13 shown in FIG. 1. The DC operating level for the transistor 40 is obtained through a coupling resistor 42 connected to the junction between a resistor 43 and a pair of transistor diodes 44 and 45, forming a voltage divider connected between a source of positive potential and ground.

The transistor diodes 44 and 45 are in the form of NPN transistors having shorted collector-base junctions, and operate in the circuit as forward-biased diodes providing a predetermined voltage drop thereacross irrespective of the amount of current flowing therethrough for the range of operation of the integrated circuit shown in the drawing. As a consequence, the diodes 44 and 45 provide a regulated DC potential for establishing the operating level of the differential amplifier circuit 40, 41.

The emitters of the transistors 40 and 41 are connected through a common emitter-resistor 46 to ground, with the collector of the transistor 40 being connected through a collector-resistor 47 to the source of positive potential and with the collector of the transistor 41 being directly connected to the source of positive potential. Output signals developed by the differential amplifier 40, 41 are obtained from the collector of the transistor 40 and are applied through a PNP amplifier transistor 48 and an NPN emitter-follower transistor 49, constituting the remainder of the feedback amplifier 13, to the base of an NPN transistor 50 forming half of a differential amplifier including a second transistor 52 and constituting the amplifier limiter circuit 16. The transistors 50 and 52 are coupled to ground through a common emitter-resistor 53, with the collector of the transistor 50 being connected directly to the source of positive potential and with the collector of the transistor 52 being connected through a limiter load resistor 54 to the source of positive potential.

The gain of the feedback amplifier 13 and the frequency shaping for the amplifier 13 are controlled by means of a feedback-shaping circuit 14 located externally of the integrated circuit chip and including a load resistor 60, across which is developed the potential for controlling the operation of the differential amplifier limiter circuit 16. Freuency shaping in the feedback circuit 14 is accomplished by an RC circuit including a pair of resistors 61, 62 and a pair of capacitors 63 and 64, with the overall gain of the amplifier 13 being controlled by a resistor 66 connected between the emitter of the transistor 49 and the base of the transistor 41.

By adjusting the value of the resistor 66, and by changing the parameters of the frequency shaping circuit 61 to 64, it is possible to cause the circuit shown in FIG. 2 to be compatible with and operate in FM receivers of different design and using discriminators of different types. If the circuit shown in FIG. 2 is to be provided as a universal circuit, the frequency-shaping circuit 61 to 64 and the gain control impedance 66 all could be made variable; but for a given application with a particular circuit, these components may be fixed components selected to match the discriminator of the receiver.

The amplified noise signals obtained from the output of the amplifier 13 through the emitter-follower 49 are applied directly to the base of the transistor 50 and through an input impedance 54 to the base of the transistor 52 in the amplifier limiter circuit 16. AC signals appearing on the base of the transistor 52 are bypassed to ground by a capacitor 57. The limiter transistors 50 and 52 operate to just limit at the audio frequencies, so that the modulation in the signal causes the limiter to provide a reduced high frequency noise output when modulation is present to compensate for increased noise caused by the modulation. At this point in the circuit, the noise from the discriminator of the receiver has been processed for optimum squelch performance. In the circuit shown in FIG. 2, the frequency-shaping preferably causes the noise utilized to control the output of the limiter 16 to lie in the frequency range between 10 and 20 kHz. since this band of noise prevents "lock-up" (feedthrough of audio and audio distortion to the squelch circuit) at the normal audio frequencies.

A noise detector transistor 70 is biased very near conduction by means of a voltage divider including a transistor diode 100 and resistors 101, 102, 103 and 104, with the resistors 102 to 104 being connected across a pair of transistor diodes 105 and 106. The potential obtained from this voltage divider is coupled to the base of the transistor 70 through another transistor diode 107 which enables the diodes 105 and 106 to provide temperature compensation of the DC bias voltage, since the change in voltage of these diodes with temper ture matches the change in voltage of the transistor diode 107 and the emitter base junction of the transistor 70. The collector of the detector transistor 70 is connected to the source of positive potential through a transistor diode 71 and a pair of resistors 72 and 73 with the emitter of the transistor 70 being connected to ground through a resistor 74. The transistor diode 71 is provided to maintain the output of the detector stage linear with the supply voltage in order to provide accurate control of the squelch level of the circuit shown. In addition, the detector stage is insensitive to the gain (beta) of the transistor 70.

The output of the amplifier limiter transistor 52 is coupled through the capacitor 17 to the base of the transistor 70 to control the conductivity thereof. The voltage output appearing on the collector of the noise detector transistor 70 is roughly proportional to the received signal strength, i.e. is increasingly positive for increasing signal and is more negative for noise. The collector load of the transistor 70 is relatively high in impedance, so that the circuitry following the detector transistor 70 must have either very large resistors or electronic circuitry with high input impedances. Since to utilize large resistors is not practical for integrated circuits, the latter approach of using electronic circuitry is used.

Two output taps are provided from the output of the transistor detector 70, one being obtained from the junction of the resistors 72 and 73 and the other being obtained from the junction of the resistor 73 with the collector of the transistor 70. Since the logic of the circuit shown in FIG. 2 is NPN logic, the long time constant filter voltage, in order to dominate, must be higher or more positive than the short time constant voltage. This is the voltage which is present at the junction between the resistors 72 and 73 and is applied to a high impedance circuit in the form of a pair of cascaded emitter-follower transistors including a first NPN transistor 75, the emitter of which is connected to the base of a substrate transistor 76, and emitter-resistor 77 connected to ground. In a discrete circuit, the transistors 75 and 76 preferably would be matched by causing them to have the same characteristics, and the values of the emitter resistors would be selected to cause both transistors to draw the same emitter current. In the circuit of FIG. 2, however, the transistors do not have the same characteristics since the transistor 76 is a substrate transistor and the transistor 75 is not. The emitter currents drawn by these transistors also may differ.

The use of the cascaded opposite conductivity type emitter-follower transistors 75 and 76 is utilized to maintain the low current drain in the circuit by providing isolation between the high impedance detector and the circuitry following the detector transistor 70. Although a single common emitter-follower transistor would solve this interfacing problem, the output of such an emitter-follower would be one diode drop (DC) lower than its input. To prevent a DC shift of this magnitude, opposite conductivity type emitter-follower transistors 75 and 76 are employed. Such a configuration still permits the high impedance isolation with a smaller change of the DC information level (of the order of 0.05 volts) because the diode drop of the NPN and PNP transistors 75 and 76 substantially subtract or cancel even though the emitter currents of these transistors may differ.

The short time constant filter voltage is developed directly at the collector of the transistor 70, with the short time constant being provided by the collector load of the transistor 70 and a capacitor 78. The short time constant voltage present on the capacitor 78 is applied through a transistor diode 79 to the base of an NPN transistor 81 constituting one of three transistors, 80, 81 and 82 in the NOR gate circuit 23. The transistor diode 79 lowers the short time constant voltage by one diode drop and maintains this voltage lower than the long time constant voltage by this amount.

The detected noise voltage obtained from the emitter of the PNP emitter-follower transistor 76 is applied through a coupling resistor 83 to the base of an NPN transistor 84, the collector of which is connected to the source of positive potential and the emitter of which is connected through a high impedance resistor 85 to ground. The transistor 84 forms an emitter-follower circuit, so that the voltage on the emitter of the transistor 84 is substantially the same as the voltage applied to the base thereof minus the base-to-emitter voltage drop. This voltage drop, however, is less than the voltage drop occurring across the resistor 73 plus the diode 79; so that the voltage on the emitter of the transistor 84 is higher than the voltage obtained from the emitter of the diode transistor 79. This voltage on the emitter of the transistor 84 is coupled to a long time constant filter consisting of an additional resistor 86 and a capacitor 87. The output of this long time constant filter is coupled directly to the base of the transistor 80 in the NOR gate circuit 23.

The charging path for the capacitor 87 is through the resistor 86 and the emitter-follower transistor 84 which is rendered conductive by received signals. With the transistor 84 cut off (noise detected), the potential stored by the capacitor 87 discharges through the resistors 85 and 86. The total impedance 85 and 86 is sufficiently large, so that the time constant of the discharge path for the filter is high. As a result, momentary fluctuations, such as fades or flutters, do not affect the voltage coupled to the base of the transistor 80 appreciably, since the voltage across the capacitor 87 does not change substantially during these fluctuation. As stated previously, the filtered noise voltage available at the output of the transistor diode 79 for the short time constant filter circuit is lower than the filtered noise voltage from the long time constant filter 85, 86, 87; so that when the long time constant filter is not interrupted, it controls the action of the squelch circuit through the transistor 80 of the NOR gate 23.

The signals obtained from the outputs of the short time constant and long time constant filter circuits and applied to the bases of the transistors 81 and 80 respectively in the NOR gate 23 are compared with a reference level established at the base of a control transistor 82 and obtained from a voltage divider including the transistor diode 100 and additional resistors 108, 110 and diodes 109 and 111 connected between a source of positive potential and ground. This is a stabilized reference voltage; and whenever the voltage levels of the signals obtained from the filter circuits both are lower than this reference voltage indicating the presence of noise and the absence of a signal, the transistor 82 is conductive and the transistors 80 and 81 are nonconductive. The conduction of the transistor 82 causes a voltage drop across a control impedance 68 to forward bias the PNP audio switch transistor 24 into conduction, causing a squelch output to be obtained from the collector thereof in the form of a current of approximately 150 microamps whenever noise is present.

For a situation, however, when a received signal is present, resulting in noise quieting, a more positive potential is obtained from the capacitor 87 in the long time constant filter circuit than is present on the base of the transistor 82; so that the transistor 80 is forward-biased into a state of conduction, thereby back-biasing the transistor 82 to render it nonconductive. This causes the potential on the base of the output switching transistor 24 to rise to a potential equal to that present on the emitter thereof, thereby rendering the transistor 24 nonconductive. The output at the collector of the transistor 24 then indicates that a signal is being received, and this output may be used to close or complete the audio channel of the receiver. It should be noted that a constant current source for the transistors 80, 81 and 82 in the NOR gate 23 is provided by means of a transistor 88 connected between the junction of the emitters of the transistors 80, 81 and 82 and an emitter-resistor 89. A source of operating potential for the transistor 88 is obtained from the junction of the resistors 103 and 104.

In order to switch the operation of the circuit to the short time constant filter capacitor 78 (that is, to remove the squelch tail) a comparator circuit 27 is provided including a pair of transistors 91 and 92 in a differential amplifier configuration. The emitter of the transistors 91 and 92 are supplied from a constant current source in the form of an NPN transistor 93, the collector of which is connected to the emitters of the transistors 91 and 92 and the emitter of which is connected through an emitter-resistor 94 to ground. Operating potential for the transistor 93 is obtained from the junction of the resistors 103 and 104, and the base of the transistor 92 is provided with a reference potential obtained from the tap of a potentiometer 115 connected across the transistor diode 109.

The potentiometer 115 is located externally of the integrated circuit in order to provide adjustment of the desired switching level of the differential amplifier circuit 27. The base of the transistor 92 also may be tied directly to the positive supply potential, thereby completely disabling the squelch tail eliminator circuit, if it is desired to operate the circuit shown in FIG. 2 as a conventional squelch circuit.

With the circuit shown connected as in FIG. 2, however, the potential present on the short time constant filter capacitor 78 (after the one diode drop through the transistor diode 79) also is applied to the base of the transistor 91 of the differential amplifier comparator circuit 27. Whenever the potential on the base of the transistor 91 exceeds the potential on the base of the transistor 92, the transistor 91 conducts, causing a voltage drop to appear across a resistor 95 connected to the collector. This voltage drop then forward-biases a PNP transistor 96 into a state of conduction causing current to flow through a pair of resistors 97 and 98 connected between the collector of the transistors 96 and ground.

When this occurs, a forward-biasing potential is applied to the base of a normally nonconductive NPN control transistor 90, causing the transistor 90 to be rendered conductive to lower the voltage applied through a resistor 99 to the base of the transistor 84 to the point that the transistor 84 is rendered nonconductive. This isolates the long time constant filter 85, 86 and 87 from the detector. At this point, the capacitor 87 commences discharging, and control of the NOR gate 23 is effected by the short time constant voltage present on the capacitor 78 and applied to the base of the NPN transistor 81.

In this condition, if the input signal is removed (noise is detected), the short time constant capacitor 78 discharges rapidly through the transistor 70, returning control of the NOR gate 23 to the reference potential applied to the base of the transistor 82. The transistor 82 conducts, which in turn causes the audio switch transistor 24 to react rapidly enough to turn off the audio section of the receiver before a "squelch tail" appears at the audio output.

If the signal fades relatively slowly to a point at which the transistor 91 is rendered nonconductive, the transistor 90 is rendered nonconductive, and the transistor 84 becomes conductive to charge the capacitor 87 rapidly; so that the long time constant filter then becomes effective to control the response time of the squelch circuit.

I claim:

1. A noise-detection and squelch filter circuit for detecting and coupling the detected noise voltage to a switch for actuating the same, said circuit including in combination:

a high gain amplifier for receiving an AC signal including noise components, circuit means responsive to the output of the amplifier for providing an output indicative of noise in a predetermined frequency range;

feedback means from the output of the amplifier for electing said predetermined frequency range sampled by the amplifier and for controlling the gain of the amplifier;

detecting means responsive to the output of the circuit means for providing an output voltage indicative of the detected noise components obtained from the circuit means;

first filter means having a particular time constant, the first filter means being adapted to receive the detected noise voltage and being responsive thereto to develop a first filtered noise voltage;

second filter means having a time constant greater than the particular time constant, the second filter means being adapted to be interrupted and further being adapted to receive the detected noise voltage to develop a second filtered noise voltage;

gating means controlled by the output voltages of the first and second filter means to produce an output;

switching means responsive to the output of the gating means for actuation thereby; and signal level detection means for receiving one of the detected noise voltage and the first filtered noise voltage for developing a control voltage therefrom upon said received one voltage being greater than a particular magnitude, the second filter means being responsive to the control voltage for interruption thereby to remove the second filter noise voltage from the input to the gating means.

2. The combination according to claim 1 wherein the amplifier, the circuit means, the detecting means, the gating means, the switch and at least a portion of the first and second filter means all are located on a single integrated circuit chip.

3. The combination according to claim 1 wherein the gating means is a NOR gate circuit having a threshold-determining means; and further including means for supplying temperature-compensated DC operating levels to the NOR gate means and to the other components of the noise detection and squelch filter circuit.

4. The combination according to claim 1 wherein the circuit means is a limiting circuit and further including a high impedance coupling circuit between the detecting means and the second filter means.

5. The combination according to claim 4 wherein the high impedance coupling circuit is in the form of a cascaded pair of opposite conductivity emitter-follower transistors formed as part of an integrated circuit including the detecting means, the opposite conductivity emitter-follower transistors providing high impedance isolation substantially without a change in the DC level of the signal obtained from the output of the detecting means passing therethrough.

6. The combination according to claim 5 wherein the second filter means includes a charge-storage means and first and second charging path means connected to the charge-storing means, the first charging path means being adapted to receive the detected noise voltage and to couple the same to the charge-storage means, the second charging path means having at least a portion thereof differing from the first charging path means and further having a higher impedance than the first charging path means, so that the time constant of the charge-storing means and the second charging path means is greater than the particular time constant.

7. The combination according to claim 6 further including means for reducing the amplitude of the first filtered noise voltage with respect to the second filtered noise voltage.

8. The combination of claim 6 wherein the first charging path means includes amplifier means having an input circuit for receiving the detected noise signal, the amplifier means further having a low impedance output circuit coupled to the charge-storing means for providing a charging path for the rapid supply of charge to the charge-storing means.

9. The combination according to claim 8 further including means for shunting the input to the amplifier means in the second filter circuit, wherein the means for producing said control voltage is a differential amplifier operated by said one voltage, the control voltage operating the shunting means to render the second filter amplifying means nonresponsive to input signals applied thereto.

10. The combination according to claim 1 wherein said high gain amplifier includes a transistor differential amplifier, and said predetermined frequency range is the range extending from the order of 10 to 20 kilohertz.

UNITED STATES PATENT OFFICE
CERTIFICATE OF CORRECTION

Patent No. 3,596,184 Dated July 27, 1971

Inventor(s) George M. Hanus et al.

It is certified that error appears in the above-identified patent and that said Letters Patent are hereby corrected as shown below:

Column 7, line 41, "elect-" should read -- select- --.

Signed and sealed this 29th day of August 1972.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334